United States Patent [19]
Brouwer et al.

[11] Patent Number: 5,936,879
[45] Date of Patent: Aug. 10, 1999

[54] PROGRAMMABLE LOGIC ARRAYS

[75] Inventors: Mark Brouwer; John Kerr, both of Lincoln, United Kingdom

[73] Assignee: Mitel Semiconductor Limited, Wiltshire, United Kingdom

[21] Appl. No.: 08/886,336

[22] Filed: Jul. 1, 1997

[30] Foreign Application Priority Data

Jul. 13, 1996 [GB] United Kingdom ............... 9614800

[51] Int. Cl.⁶ ............................. G11C 11/22; G11C 16/04

[52] U.S. Cl. ............... 365/145; 365/189.05; 365/185.14; 365/104

[58] Field of Search ..................................... 365/145, 200, 365/189.05, 189.08, 104, 185.14; 326/38

[56] References Cited

U.S. PATENT DOCUMENTS

| | | |
|---|---|---|
| 4,918,654 | 4/1990 | Eaton, Jr. et al. .................. 365/145 |
| 5,198,706 | 3/1993 | Papaliolios . |
| 5,592,410 | 1/1997 | Verhaeghe et al. .................. 365/145 |

*Primary Examiner*—David Nelms
*Assistant Examiner*—Thong Le
*Attorney, Agent, or Firm*—Kirschstein, et al.

[57] ABSTRACT

A programming or function-setting cell for a field programmable gate array utilizes ferroelectric capacitors connected to the nodes of a latch circuit to retain charge representing the state of the cell so that, following a power loss or a specific event upset, the programming information held by the latch circuit may be reinstated. The latch circuit comprises a pair of inverters having their inputs and outputs cross-coupled by way of respective switching transistors, and the capacitors are connected between the nodes and a common plate conductor normally held at a potential intermediate the supply potentials for the inverters.

10 Claims, 3 Drawing Sheets

PROGRAMMABLE LOGIC ARRAYS

BACKGROUND OF THE INVENTION

The present invention relates to programmable logic arrays, commonly referred to as programmable gate arrays, and in particular although not exclusively to arrays of the form sometimes referred to as field programmable gate arrays (FPGAs). Such gate arrays offer an alternative to application-specific integrated circuits (ASICs), with the advantage of rapid design implementation.

In one known form of FPGA, "antifuses" are used to create the required logic connections, providing a permanent, one shot, logic structure. These connections are virtually immune to radiation damage or specific event upsets. Another form of FPGA utilises memory, either PROM or EPROM, to store design data which may be downloaded to program the array. Such an arrangement allows the array to be reprogrammed if required, but is liable to loss of data if the power supply is interrupted or when subjected to radiation or any specific event upsets.

In an arrangement disclosed in U.S. Pat. No. 5,198,706, programming cells for FPGAs make use of volatile memory cells to hold programming information, with ferroelectric capacitors provided to reset the states of these volatile memory cells when required, say, after a power-down.

SUMMARY OF THE INVENTION

According to one aspect of the present invention in a programmable logic array including at least one function-setting means for determining the function of a respective logic cell of the array, the function-setting means comprises a pair of inverters, a pair of switch means each operable to connect the output of a respective one of said pair of inverters to the input of the other of said pair of inverters to form a latch circuit, and a pair of ferroelectric capacitors each having one electrode thereof connected to the input of a respective one of said pair of inverters and the other electrode thereof connected to potential-setting means common to said pair of capacitors.

According to another aspect of the present invention in a programmable logic array comprising a plurality of logic cells each including function-setting means for determining the function of the respective cell in any given application of the array, each function-setting means comprises a pair of inverters, a pair of switch means each operable to connect the output of a respective one of said pair of inverters to the input of the other of said pair to form a latch circuit, and a pair of ferroelectric capacitors each having one electrode thereof connected to the input of a respective one of said pair of inverters and the other electrode thereof connected to potential-setting means common to said pair of capacitors.

BRIEF DESCRIPTION OF THE DRAWINGS

A programmable logic array in accordance with the present invention will now be described by way of example with reference to the accompanying drawings, of which.

DETAILED DESCRIPTION OF THE PREFERRED EMBODIMENTS

Figure 1:
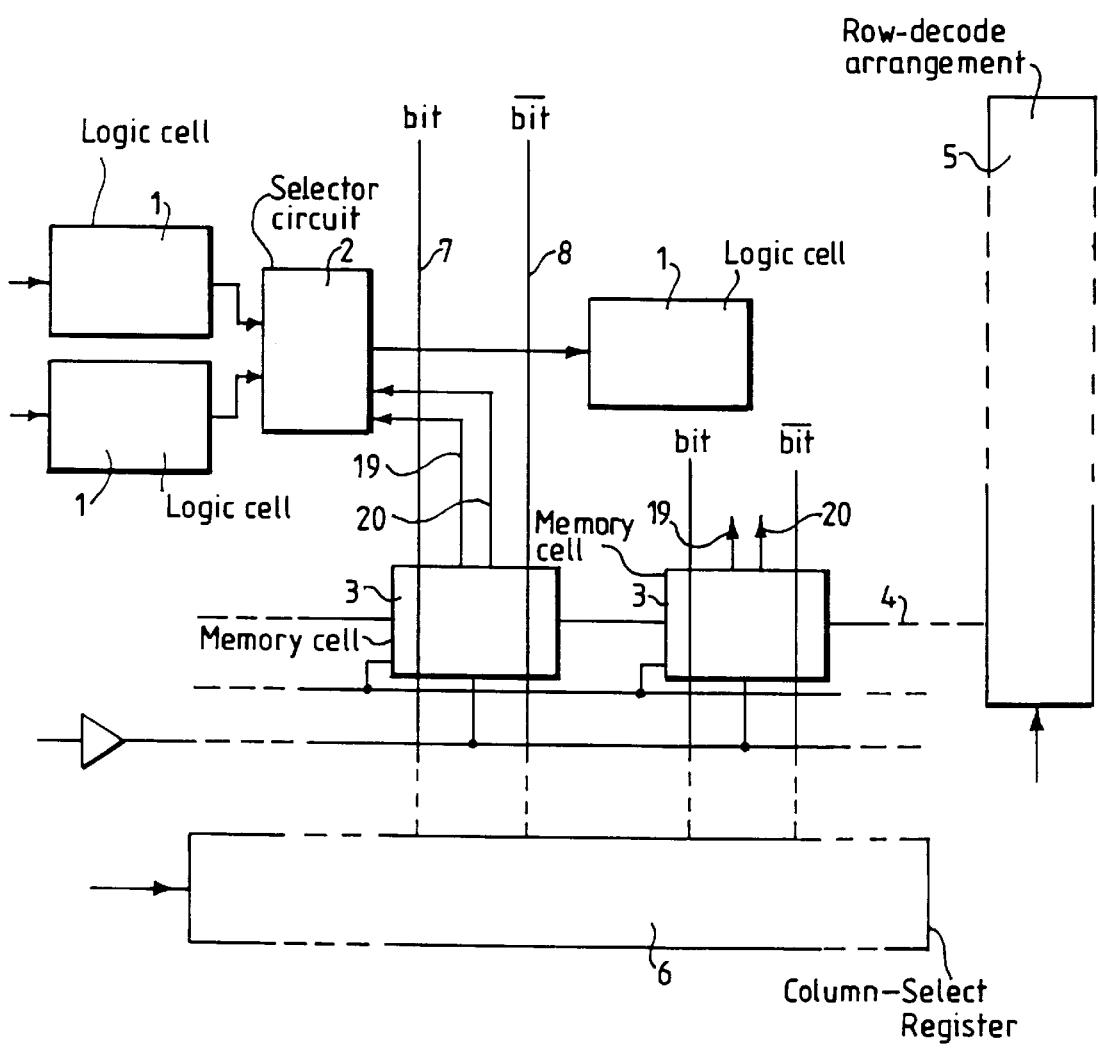
FIG. 1 shows part of the array schematically.

Referring first to FIG. 1, the logic array comprises a plurality of gate cells or logic cells 1, of which only three are shown, these cells 1 being arranged for example in rows and columns (not shown). Interconnections between respective cells 1 may be controlled for example by means of circuits such as selector circuit 2, under the control of a respective one of a plurality of function-determining ferroelectric memory cells 3. Other such memory cells (not shown) may be used to program individual logic cells 1 as AND gates, OR gates or latches. The state of each memory cell 3 may be set, by means of a row-select signal on a respective path 4 from a row-decode arrangement 5, in accordance with values provided from a column-select register 6 on bit and bit-bar paths 7 and 8 respectively.

Figure 2:
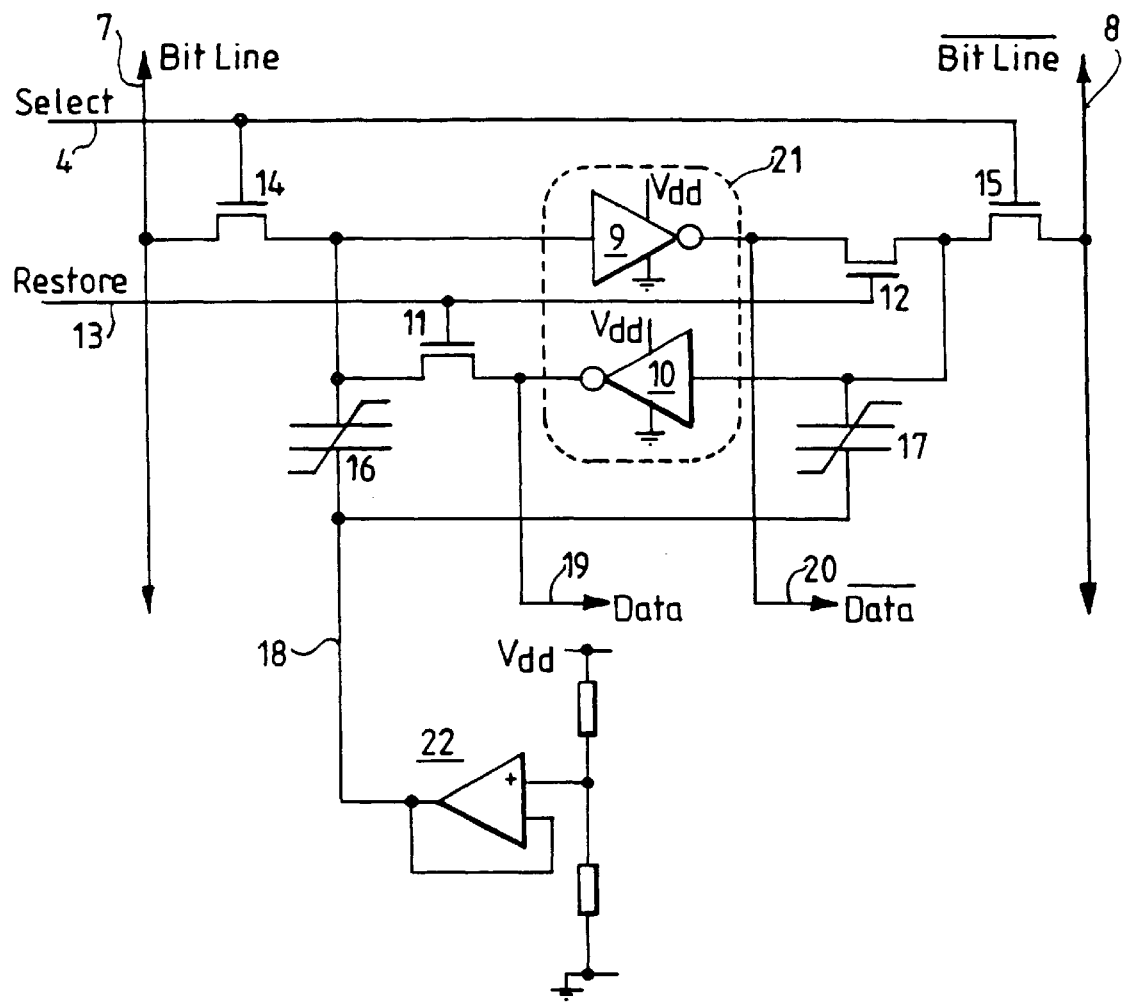
FIG. 2 shows part of FIG. 1 in greater detail.
Figure 3A:
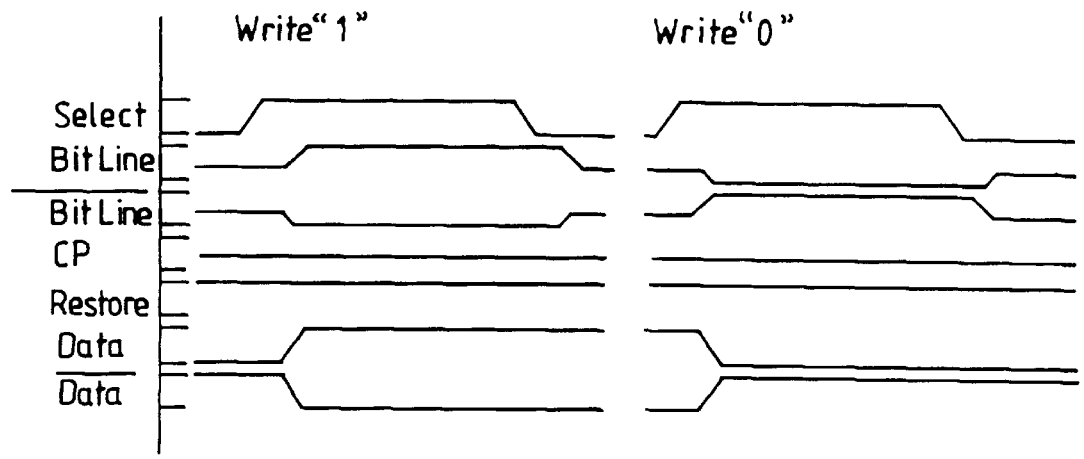
FIGS. 3(a) and 3(b) show voltage levels and level variations illustrating the operation of the array.
Figure 3B:
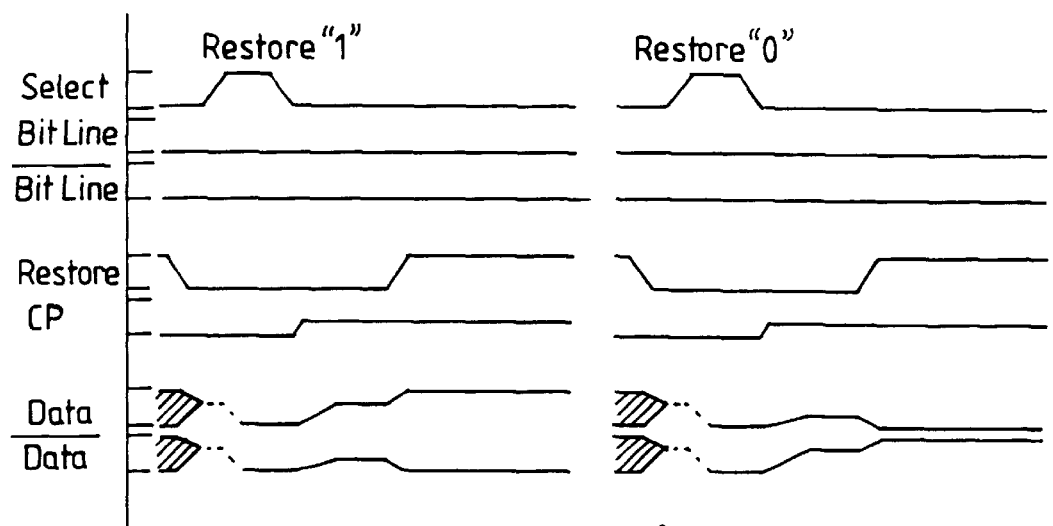

Referring also to FIGS. 2, 3(a) and 3(b), each memory cell 3 comprises a pair of inverters 9 and 10 which are interconnected by way of field-effect transistors 11 and 12 to act as a latch circuit 21 when these transistors are biased into conduction, the necessary bias being applied selectively to a "restore path" path 13 connected to the gate electrodes of the transistors 11 and 12. The state of this latch circuit 21 may be set in accordance with a binary value represented by the potentials applied by way of the respective bit and bit-bar paths 7 and 8 from the register 6 (FIG. 1), and access transistors 14 and 15, when the transistors 11 and 12 are biased into conduction and when an appropriate row-select signal is applied to a respective path 4 from the row-decode arrangement 5 (FIG. 1).

While the state of the latch circuit 21 is being set, potentials are set up at the inputs of the inverters 9 and 10 which set the states of polarisation of a pair of ferroelectric capacitors 16 and 17 which are connected respectively between those inputs and a common plate conductor 18 which is held at an intermediate potential, such that one of the capacitors 16 and 17 is polarised in one sense and the other in the opposite sense. For example, where the potentials set up at the inputs of the inverters 9 and 10 are nominally 5 volts and 0 volts, the conductor 18 may be held at or near 2½ volts by means of a buffer amplifier circuit 22, the potential differences set up across the capacitors 16 and 17 being sufficient to polarise these capacitors, in the respective senses, and the outputs of the preceding inverters 10 and 9 being of sufficiently low impedance to source or sink the necessary flow of charge.

Ferroelectric capacitors hold large amounts of charge when polarised, of the order of, say, 20 microcoulombs per square centimetre, so that a relatively small capacitor, say 5 micrometers square, may hold 5 picocoulombs. Once polarised these ferroelectric capacitors 16 and 17 will hold their state for long periods without further input from any of the paths 4, 7, 8, 13 or the conductor 18.

When the programming of the gate array is to be restored, for example on power-up, as shown in FIG. 3(b) the inputs of the inverters 9 and 10 may initially be at zero volts or may be set to zero volts, as may the common plate conductor 18. If the conductor 18 is raised to the intermediate potential of 2½ volts, the capacitor 16 or 17 which was polarised in the opposite sense to the voltage now applied to it will be repolarised, thereupon dumping a large amount of charge into the input of the respective inverter 9 or 10. The other capacitor 17 or 16 will dump significantly less charge into the input of its respective inverter 10 or 9 since it merely makes an excursion in its remanent polarised state. If the restore path 13 is now set high, so that the transistors 11 and 12 become conducting, the inverter 9 or 10 which received the large amount of charge into its input will drive the capacitor 17 or 16 at its output to logic low and, by way of the other inverter 10 or 9, will repolarise the capacitor 16 or 17 which dumped the large amount of charge to its correct state. The capacitors 16 and 17 are thus automatically read back to their initial values as part of the restore operation.

While the array is powered-up the logic state represented by the polarisation states of the capacitors 16 and 17 is made available to gate array circuits such as, say, the selector circuit 2 (FIG. 1) by way of data and data-bar paths 19 and 20. Once the array is powered-up and the programming data restored, the potential applied to the restore path 13 may be removed, so that any transients on the data and data bar paths 19 and 20 will not be able to change the state of the latch circuit 21 and thereby the charge states of the capacitors 16 and 17.

The application of potentials to the common plate conductor 18 and the restore path 13 will restore all of the cells 3 in an array simultaneously. The application of the intermediate potential on the conductor 18 simplifies the write operation and halves the voltage across the capacitors 16 and 17, thereby reducing the charge dumped and the resulting voltage excursion at the inputs of the inverters 9 and 10, and improving the reliability of the capacitors.

We claim:

1. A programmable logic array, comprising: at least one function-setting means for determining a function of a respective logic cell of the array, the at least one function-setting means including first and second inverters each having an input and an output, first and second switch means, first and second ferroelectric capacitors each having first and second electrodes, the first switch means being operable to connect the output of the first inverter to the input of the second inverter, the second switch means being operable to connect the output of the second inverter to the input of the first inverter to form a latch circuit, the first ferroelectric capacitor having its first electrode connected to the input of the first inverter, the second ferroelectric capacitor having its first electrode connected to the input of the second inverter, and potential-setting means connected to the second electrode of both of the first and second ferroelectric capacitors.

2. The programmable logic array of claim 1, wherein each of the switch means comprises a field effect transistor.

3. The programmable logic array of claim 1, wherein the potential-setting means is arranged to set a potential at the second electrode of both of the ferroelectric capacitors at a value between values of potential on supply conductors for the inverters.

4. The programmable logic array of claim 1, wherein the first and second switch means are operable to connect the first and second inverters as a latch or as respective latches in response to a potential applied over a common path to a control input.

5. A programmable logic array, comprising: a plurality of logic cells each including function-setting means for determining a function of the respective logic cell in any given application of the array, each function-setting means including first and second inverters each having an input and an output, first and second switch means, first and second ferroelectric capacitors each having first and second electrodes, the first switch means being operable to connect the output of the first inverter to the input of the second inverter, the second switch means being operable to connect the output of the second inverter to the input of the first inverter to form a latch circuit, the first ferroelectric capacitors having its first electrode connected to the input of the first inverter, the second ferroelectric capacitor having its first electrode connected to the input of the second inverter, and potential-setting means connected to the second electrode of both of the first and second ferroelectric capacitors.

6. The programmable logic array of claim 5, wherein each of the switch means comprises a field effect transistor.

7. The programmable logic array of claim 5, wherein the potential-setting means is arranged to set a potential at the respective second electrodes of the ferroelectric capacitors at a value between values of potential on supply conductors for the inverters.

8. The programmable logic array of claim 5, wherein the function-setting means are arranged in rows and columns, and the input of each inverter of each function-setting means in a column of function-setting means is arranged to be connected respectively to bit and bit-bar conductors common to the column by way of respective access transistors.

9. The programmable logic array of claim 8, wherein the access transistors in respect of each row of function-setting means are arranged to be controlled by means of a row-select conductor common to the function-setting means of that row.

10. The programmable logic array of claim 5, wherein the first and second switch means are operable to connect the first and second inverters as a latch or as respective latches in response to a potential applied over a common path.

\* \* \* \* \*